United States Patent
Trinkert et al.

(10) Patent No.: US 10,011,185 B2
(45) Date of Patent: Jul. 3, 2018

(54) METHOD FOR BATTERY MANAGEMENT AND BATTERY MANAGEMENT SYSTEM

(71) Applicants: Robert Bosch GmbH, Stuttgart (DE); Samsung SDI Co., Ltd., Yongin-si, Gyeonggi-do (KR)

(72) Inventors: Stefan Trinkert, Gaeufelden (DE); Andreas Lemke, Heidelberg (DE); Ralf Piscol, Herrenberg (DE); Ralf Link, Niedernhall (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 227 days.

(21) Appl. No.: 14/902,906

(22) PCT Filed: Jul. 2, 2014

(86) PCT No.: PCT/EP2014/064068
§ 371 (c)(1),
(2) Date: Jan. 5, 2016

(87) PCT Pub. No.: WO2015/000960
PCT Pub. Date: Jan. 8, 2015

(65) Prior Publication Data
US 2016/0144736 A1    May 26, 2016

(30) Foreign Application Priority Data
Jul. 5, 2013    (DE) .................. 10 2013 213 267

(51) Int. Cl.
*G01R 31/36*    (2006.01)
*B60L 11/18*    (2006.01)
(Continued)

(52) U.S. Cl.
CPC ............. *B60L 11/1851* (2013.01); *B60L 3/12* (2013.01); *B60L 11/1857* (2013.01);
(Continued)

(58) Field of Classification Search
CPC .... B60L 11/1851; B60L 3/12; B60L 11/1857; G01R 31/3606; G01R 31/3651
See application file for complete search history.

(56) References Cited

U.S. PATENT DOCUMENTS 9,575,128 B2 *    2/2017    Frost .................. G01R 31/3624
9,601,814 B2 *    3/2017    Brandt ................ H01M 10/06
(Continued)

FOREIGN PATENT DOCUMENTS

DE    10 2010 001 529 A1    8/2011
DE    10 2010 038 017 A1    4/2012
(Continued)

OTHER PUBLICATIONS

International Search Report corresponding to PCT Application No. PCT/EP2014/064068, dated Oct. 27, 2014 (German and English language document) (10 pages).

*Primary Examiner* — Pho M Luu
(74) *Attorney, Agent, or Firm* — Maginot, Moore & Beck LLP

(57) ABSTRACT

The disclosure relates to a method for battery management, wherein a magnitude of a current that can be provided by the battery within a prediction period is determined from an available magnitude of a status variable, which is predicted within the prediction period, wherein the predicted available magnitude of the status variable is determined by means of a difference between a permissible magnitude of the status variable, which is determined for a first reference period, and an obtained magnitude of the status variable, which is determined for the first reference period. The disclosure also (Continued)

relates to a computer program and a battery management system suitable for carrying out the method and to a motor vehicle having such a battery management system.

5 Claims, 2 Drawing Sheets

(51) Int. Cl.
| | |
|---|---|
| *B60W 10/26* | (2006.01) |
| *H01M 10/42* | (2006.01) |
| *H01M 10/44* | (2006.01) |
| *H01M 10/48* | (2006.01) |
| *H02J 7/00* | (2006.01) |
| *B60L 3/12* | (2006.01) |

(52) U.S. Cl.
CPC ......... *B60W 10/26* (2013.01); *G01R 31/3606* (2013.01); *G01R 31/3651* (2013.01); *H01M 10/425* (2013.01); *H01M 10/44* (2013.01); *H01M 10/48* (2013.01); *H01M 10/486* (2013.01); *H02J 7/0029* (2013.01); *B60L 2240/545* (2013.01); *B60L 2240/547* (2013.01); *B60L 2240/549* (2013.01); *B60L 2240/80* (2013.01); *B60L 2260/44* (2013.01); *B60W 2510/244* (2013.01); *H01M 2010/4271* (2013.01); *H01M 2220/20* (2013.01); *H02J 2007/0039* (2013.01); *H02J 2007/0067* (2013.01); *Y02T 10/705* (2013.01); *Y02T 10/7011* (2013.01); *Y02T 10/7016* (2013.01)

(56) References Cited

U.S. PATENT DOCUMENTS

| | | | |
|---|---|---|---|
| 9,658,293 B2 * | 5/2017 | Kimura | G01R 31/3648 |
| 2008/0304199 A1 | 12/2008 | Cruise et al. | |

FOREIGN PATENT DOCUMENTS

| | | |
|---|---|---|
| DE | 10 2011 054 144 A1 | 4/2012 |
| DE | 10 2011 007 895 A1 | 10/2012 |
| DE | 10 2012 007 157 A1 | 10/2012 |
| EP | 2 048 735 A1 | 4/2009 |

\* cited by examiner

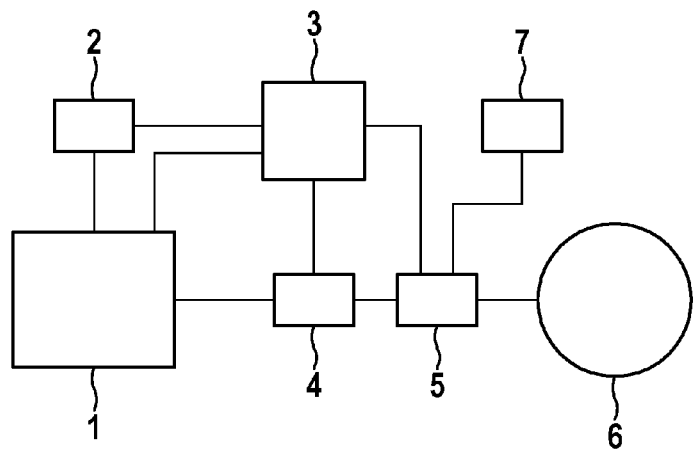
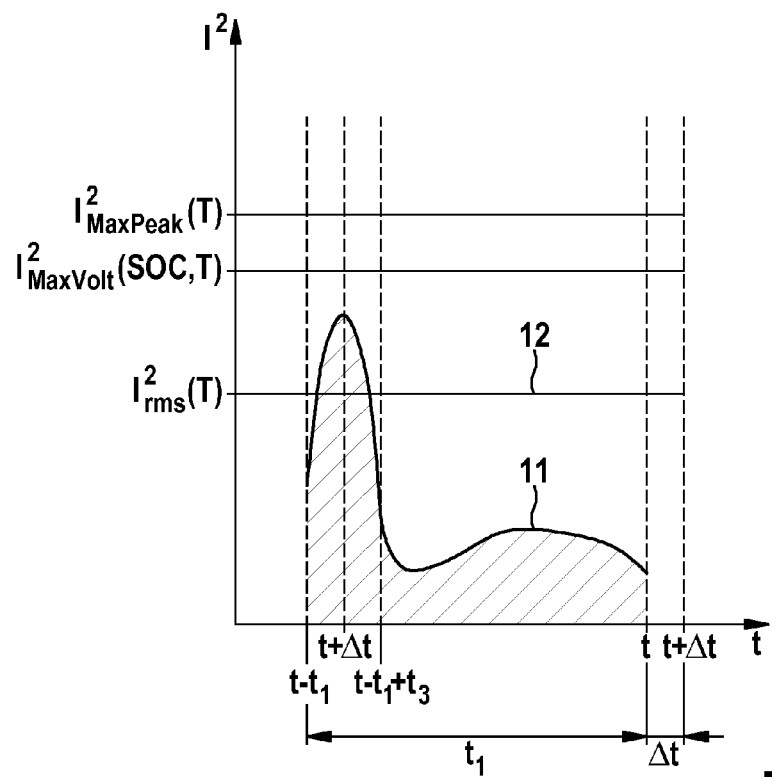

METHOD FOR BATTERY MANAGEMENT AND BATTERY MANAGEMENT SYSTEM

This application is a 35 U.S.C. § 371 National Stage Application of PCT/EP2014/064068, filed on Jul. 2, 2014, which claims the benefit of priority to Serial No. DE 10 2013 213 267.0, filed on Jul. 5, 2013 in Germany, the disclosures of which are incorporated herein by reference in their entirety.

BACKGROUND

The disclosure relates to a method for battery management and a battery management system.

Subject matter of the disclosure is also a computer program and a motor vehicle having a battery management system.

More and more frequently, an accumulator is used as energy source in electrically driven vehicles. In the present description, the terms "battery" and "battery system" are used for accumulator or accumulator system, respectively, adapted to the conventional linguistic use. In this context, battery cells based on lithium are increasingly used since these currently have the greatest available energy density with the lowest weight, particularly in comparison with accumulators based on nickel or lead. Of these accumulators, a life of 10 years or more is demanded. However, the demands on accumulators in vehicles are different from those which are made on accumulators installed in mobile telephones or notebooks. The accumulators in vehicles are rather comparable to accumulators in model construction. For the demanded life to be achieved, a so-called battery management system is usually allocated to the accumulators which, among other things, performs a battery status detection and provides thermal management of the batteries.

SUMMARY

In the method for battery management according to the disclosure, it is provided that a magnitude of current disclosure, which can be provided by the battery within a prediction period $\Delta t$ is determined from an available magnitude $K_R$ of a status variable, which is predicted within the prediction period $\Delta t$, wherein the predicted variable magnitude $K_R$ of the status variable is determined by means of a difference between a permissible magnitude $K_{max}$ of the status variable, which is determined for a first reference period $t_1$ and an obtained magnitude K of the status variable, which is determined for the first reference period $t_1$.

The magnitude of the current $I_V$ which can be provided by the battery can be conveyed to a suitable control system of the battery so that an inverter is provided accordingly and only draws this current. By means of the method according to the disclosure, damages to the accumulator due to too high a power delivery are prevented and a given guarantee of life of the battery is met in a better way. The battery management prevents not only possible damages due to maximum currents on the battery but provides an optimization of the power delivery at certain charging and discharging states with regard to the battery cell parameters. Thus, according to the disclosure, monitoring algorithms are provided for current regulation which, in particular, ensure that the battery operates and ages within the desired range and thus does not have to be exchanged prematurely.

The method is particularly suitable in the case of batteries which are used in electrical vehicles or hybrid vehicles. The demands on these batteries comprise, for example, that it should deliver between 50 V and 600 V voltages. Examples of suitable battery types comprise all types of lithium ions (for example lithium iron phosphate, lithium nickel manganese, cobalt, lithium iron sulfide, lithium polymer, lead acid, advanced lead acid, nickel metal hydride, nickel cadmium, zinc bromide, sodium nickel chloride, zinc air or lithium air). In the application of the method, the development of a damaging temperature gradient in the battery is prevented, on the one hand, in particular, and, on the other hand, also the deposition of the ions in the charging case which is known as so-called lithium plating in the case of lithium ions.

By means of the measures listed in the dependent claims, advantageous developments and improvements of the method specified in the independent claim are possible.

A suitable status variable, the available magnitude $K_R$ of which is utilized for calculating the magnitude of current $I_V$ which can be provided is, for example, electrical energy. However, it has been found that monitoring another status variable than energy is particularly well suited for the specified purposes and can also be easily measured.

The status variable is preferably a status variable which is energy-like in the wider sense and has the unit J/Ω in a suitable Ohmic model of the battery. The magnitude of the current $I_V$ which can be provided within the prediction period $\Delta t$ is then determined by forming a quotient from the magnitude of the status variable $I_V$ which can be provided and prediction period $\Delta t$ followed by extracting the root, i.e. there is a physical relationship between the status variable used preferably and the current, according to $$K = I^2 t,$$

wherein K designates the status variable, I is the current measured in A and t is the time measured in s. The measurements of the battery current I and of the time can be managed cost effectively and are provided serially in many battery management systems. Compared with monitoring and energy-based result, the consideration of the generally complex temperature-, time- and current-dependent resistance of the battery, the determination of which possibly requires additional measuring devices, or the consideration of a capacity, for example, is omitted in the Ohmic case depending on the pattern of model which is used as a basis for the battery.

The prediction period is a particular period between 2 s and 200 s, preferably between 5 s and 100 s, for example 10 s or 20 s. The first reference period in which the permissible and the obtained magnitude of the status variable is determined is preferably specified to be greater than the prediction period, for example a particular period between 5 s and 1000 s, preferably between 10 s and 200 s, particularly 100 s or 150 s. The greater the first reference period, the more reliable can be the prediction of the current which can be provided. Conversely, however, a certain heat dissipation in the battery cells must also be taken into consideration so that the influence of great loading of the battery, i.e. particularly a high current flow over a particular period is no longer of significance after a particular time. A sensible solution in this case is a period between 10 s and 200 s of monitoring and between 5 s and 20 s of prediction.

According to a preferred embodiment the predicted available magnitude $K_R$ of the status variable is increased by a magnitude $K_N$ of an obtained status variable determined with respect to a second reference period $t_2$. The second reference period $t_2$ preferably has approximately the size of the prediction period $\Delta t$ and begins at the beginning of the first reference period $t_1$. If at the beginning of the first reference period $t_1$, which is significant for determining the permissible and the obtained magnitude of the status variable, an acceleration event has taken place, for instance, which has lasted a particular period of time, followed by a very low power requirement, the predicted available magnitude of the status variable greatly increases after the certain period of time and a greater current can be effectively provided.

According to a development of the disclosure, a precautionary limit current $I_{lim}$ is provided which is determined from a product of the current $I_V$ which can be provided in the prediction period $\Delta t$ with a further function, the further function depending on a ratio k of the obtained magnitude K of the status variable with respect to the permissible magnitude $K_{max}$ of the status variable. The value of the precautionary limit current can be provided to a suitable control system of the battery so that the inverter is correspondingly set and only draws this current. Limiting the current to the precautionary limit current prevents accelerated aging even more and, nevertheless, allows homogeneous power delivery.

It is particularly advantageous if the further function is essentially constant, for example equal to one, below a critical threshold of the ratio k of the obtained magnitude K of the status variable with respect to the permissible magnitude $K_{max}$ of the status variable and drops monotonically above the critical threshold. The critical threshold is a particular number between 0 and 1, preferably between 0.3 and 0.7 or between 0.4 and 0.6, particularly preferably approximately 0.5. Below the critical threshold, the obtained magnitude of the status variable is much lower than the permissible magnitude of the status variable so that the current limiting does not need to be increased. Above the critical threshold, that is to say when the obtained magnitude of the status variable reaches the vicinity of the permissible magnitude of the status variable, the current is limited more, namely the more the greater the ratio of the magnitudes is with respect to one another. The characteristic of monotonically dropping can be reached, for example, by a linearly dropping behavior of the further function above the critical threshold. By means of the adjustable critical threshold, a further parameter is provided for the active temperature management of the battery.

According to the disclosure, a computer program is also proposed according to which one of the methods described herein is performed when the computer program is executed on a programmable computer device. The computer program can be, for example, a module for implementing a battery management system or a subsystem thereof in a vehicle. The computer program can be stored on a machine-readable storage medium, for instance on a permanent or rerecordable storage medium or in allocation to a computer device or on a removable CD-ROM, DVD or a USB stick. Additionally or as an alternative, the computer program can be provided on a computer device such as, for example, a server or a cloud system for downloading, for example via a data network such as the Internet or a communications link such as a telephone line or a wireless connection.

According to the disclosure, a battery management system is also provided which comprises diagnostic sensors for providing information on temperatures and currents of a battery, a module for determining a magnitude $K_{max}$, permissible with respect to a first reference period $t_1$, of a status variable, a module for determining a magnitude K, obtained with respect to the first reference period $t_1$, of the status variable, a module for determining a predicted available magnitude $K_R$ of the status variable from the permissible magnitude $K_{max}$ of the status variable and the obtained magnitude K of the status variable, and a module for determining a magnitude of a current $I_V$ which can be provided from the available magnitude $K_R$, predicted in the prediction period $\Delta t$, of the status variable, which is particularly suitable for execution of one of the methods described above.

According to a further aspect of the disclosure, a motor vehicle with an electrical drive motor for driving the motor vehicle and a battery connected to the electrical drive motor comprises such a battery management system. However, the battery management system can also be part of a battery-driven electrical device, particularly used in tools such as battery-driven screwdrivers, drilling machines or also in mobile telephones or notebooks.

By means of the solution proposed according to the disclosure, a method for battery management is presented which would bring battery management into focus not only with respect to possible damages by maximum currents. The management and the optimization of the power delivery under certain charging and driving states with regard to the parameters of the battery cells is taken into consideration in the management by the solution proposed according to the disclosure, apart from consideration of maximum currents for battery cells and ensuing damage. The monitoring algorithms specified with the solution proposed according to the disclosure are used for current regulation and ensure that the battery or the battery cells, respectively, or a battery pack comprising a number of battery cells, operate within the desired range and thus also age as little as possible, so that a premature exchange of battery cells or of the battery cell pack can be avoided in operation and with the method proposed according to the disclosure.

By means of the method proposed according to the disclosure, it is advantageously possible to achieve that the battery management system ensures by means of the proposed algorithms that the vehicle and the accumulator are operated within optimum limits and, if necessary, a requested performance of the driver is not called for.

BRIEF DESCRIPTION OF THE DRAWINGS

Illustrative embodiments are shown in the drawings and explained in greater detail in the subsequent description, in which:

FIG. 1 shows a diagrammatic representation of a vehicle control system,

FIG. 2 shows a variation with time of a current in a battery, and

DETAILED DESCRIPTION

Figure 3:
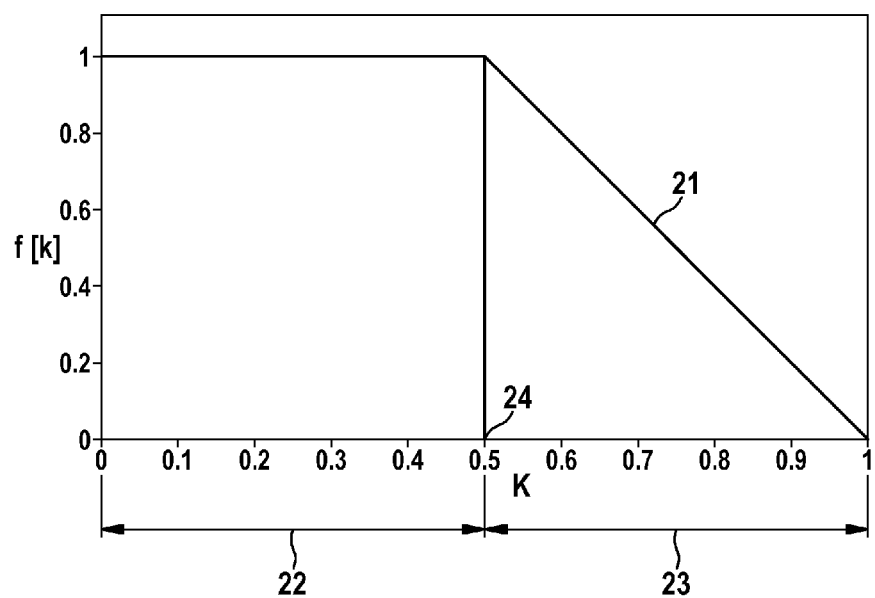
FIG. 3 shows a variation of a limiting function.

FIG. 1 shows a diagrammatic representation of a vehicle control system. An accumulator 1 is connected via a BDU (battery disconnect unit) 4 and an inverter 5 to a motor 6. The accumulator 1 can comprise individual battery cells which, for example, are connected in series with one another, a plurality of battery modules which have one individual battery cell or a plurality of battery cells interconnected in series and/or in parallel, or also have singular or a plurality of battery module rows in which individual or a plurality of battery modules are interconnected in series and/or in parallel. The accumulator 1 is monitored by a battery management system 3 (BMS) which obtains via diagnostic sensors, for example, information about currents, voltages and temperatures in the battery and controls a cooling system 2. The gas pedal 7 of the vehicle is connected to the inverter 5 and specifies the required power.

The mode of operation of the disclosure then consists in that the battery management system 3 ensures by means of an algorithm that an operation of the vehicle and of the accumulator 1 takes place within the optimum and inventive limits, possibly by not meeting the power inputs of the gas pedal 7.

FIG. 2 shows by way of an example a variation with time 11 of the square of a current $I^2$ (t) which was provided, for example, by the accumulator 1 shown in FIG. 1. A boundary condition for the current flow during charging and discharging is $$|I(t)| < |I_{MaxPeak}(T)|,$$

i.e. the maximum value of the current I(t) must always be below the temperature-dependent maximum value $I_{MaxPeak}$(T). A further condition is $$|I(t)| < |I_{MaxVolt}(SOC,T)|,$$

i.e. the maximum value of the current I(t) must always be below the temperature-dependent and SOC-dependent maximum value $I_{MaxVolt}$ (SOC, T) both during charging and during discharging. This limit value takes into consideration the internal resistance of the battery and ensures that it stays within the voltage limits.

In FIG. 2, a first reference period $t_1$ begins at a time $t-t_1$ and ends at a time t. A magnitude K, obtained in the first reference period $t_1$, of a status variable is determined according to $$K = \int_{t-t_1}^{t} I^2(t')dt'$$

by a suitable module of the battery management system by integration of the variation with time 11 of the current I(t) over the first reference period $t_1$. The determination of this and of other magnitudes can take place by hardware components and/or include calculations of software components, particularly those of the BMS.

A second curve 12 shows the variation of a square of a temperature-dependent life-optimized limit value of the current $I^2_{rms}$(T) over the first reference period $t_1$ from $t-t_1$ to t. The temperature-dependent life-optimized upper limit of the current $I_{rms}$(T) is here assumed to be constant over time, i.e. in particular, temperature fluctuations are not taken into consideration and, for determining a permissible magnitude $K_{max}$ of the status variable, $$K_{max} = I^2_{rms}(T)t_1$$

is used. The permissible magnitude $K_{max}$ of the status variable is thus determined by a square of the temperature-dependent life-optimized current value $I^2_{rms}$(T) which is multiplied by the first reference period $t_1$.

During the charging, K must be lower than the limit value $K_{max}$. This similarly applies to the discharging, wherein the reference period $t_1$ can be different during the charging than the reference period $t_1$ during the discharging. The different values for the charging and discharging process are based on the different chemical processes.

The predicted available magnitude $K_R$ of the status variable is determined by means of the difference from the permissible magnitude $K_{max}$, determined with respect to the first reference period $t_1$, of the status variable and the obtained magnitude K, determined with respect to the second reference period $t_1$, of the status variable according to $$K_R = t_1 I^2_{rms}(T) - \int_{t-t_1}^{t} I^2(t')dt'.$$

If at time $t-t_1$, i.e. at the beginning of the first reference period $t_1$, as shown, an acceleration event has taken place which has lasted approximately a time $t_3$, followed by a very low power demand, the predicted available magnitude $K_R$ of the status variable will predicatively increase very much within the prediction period Δt. In general, this can be taken into consideration by the fact that the predicted available magnitude $K_R$ can be increased by a further positive summand $$K_N = \int_{t-t_1}^{t-t_1+t_2} I^2(t')dt'$$

i.e. by a magnitude $K_N$ of the obtained status variable determined with respect to a second reference period $t_2$. The choice of the second reference period $t_2$, shown in the example, is found to be practicable in the magnitude of the prediction period Δt, that is to say $$K_R = t_1 I^2_{max}(T) - \int_{t-t_1}^{t} I^2(t')dt' + \int_{t-t_1}^{t-t_1+\Delta t} I^2(t')dt'.$$

The current $I_V$ which can be provided within the prediction period Δt is calculated by forming a quotient from the predicted available magnitude $K_R$ of the status variable and the prediction period Δt and subsequent extraction of the square root according to $$I_V = \sqrt{\frac{t_1 I^2_{max}(T) - \int_{t-t_1}^{t} I^2(t')dt'}{\Delta t}},$$

or under consideration of the further summand $K_N$ according to $$I_V = \sqrt{\frac{t_1 I^2_{max}(T) - \int_{t-t_1}^{t} I^2(t')dt' + \int_{t-t_1}^{t-t_1+\Delta t} I^2(t')dt'}{\Delta t}}.$$

This value can be conveyed to the vehicle so that the inverter is correspondingly set and only draws this current which can be designated as released. If, however, this value is exceeded nevertheless, the inverter thus does not react in accordance with the specifications, a further object of the method according to the disclosure is thus to avoid that $K_R$=0 occurs since then no further current can flow and the vehicle can then no longer move.

FIG. 3 shows the variation of a limiting curve 21 which is used for determining a precautionary limit current $I_{lim}$, the operation of the vehicle and of the accumulator 1 taking place within the value specified by the precautionary limit current in order to achieve also the said further object. The limiting curve 21 depends on the ratio k of the predicted available magnitude of the status variable $K_R$ with respect to the permissible magnitude $K_{max}$ of the status variable, i.e.

$$f(k)=f(K_R/K_{max}).$$

In a first section 22, the limiting curve 21 is constantly one and monotonically drops in a further section 23 until it has dropped to 0 at the value k=1, i.e. $K_R=K_{max}$. The first area 22 and the second area 23 are separated by a critical threshold 24 which is at k=0.5 in the example shown. In principle, the variation of the limiting curve 21 can vary. For example, the limiting function 21 does not have to be constant in the first area 22 but can also fluctuate here, particularly fluctuates slightly. In area 23, the dropping variation can be shaped differently and does not need to extend linearly as in the exemplary embodiment shown. In particular, an exponential, a logarithmic or a polynomial variation is possible. The critical threshold 24 can be a defined number between 0 and 1, particularly between 0.4 and 0.6, and is specified as 0.5 only by way of example.

The precautionary limit current $I_{lim}$ is formed from the product of the current $I_V$ provided in the prediction period $\Delta t$ with the limiting function 21, particularly according to $$I_{lim}=I_V f(k).$$

The disclosure is not restricted to the exemplary embodiments described here and the aspects emphasized therein. Instead, a multiplicity of deviations which are within the boundaries of technical action is possible within the range specified by the claims.

The invention claimed is:

1. A method of controlling a current level delivered from a battery system to an electric motor in a vehicle comprising:
   generating, with a current sensor, a plurality of current level measurements of electrical current that a battery in the battery system provides to the electric motor during a predetermined time period;
   identifying, with a battery management system, a first level of energy provided by the battery system to the electric motor at a first point in time after a start of the predetermined time period based on a summation of squares of the plurality of current level measurements;
   identifying, with the battery management system, a maximum current level that can be provided to the electric motor from the battery during a remainder of the predetermined time period after the first point in time and prior to an expiration of the predetermined time period to enable a total level of energy provided to the electric motor by the battery during the entire predetermined time period to remain below a predetermined total energy limit;
   receiving an input corresponding to a first electrical current level to be applied to the electric motor in the vehicle from the battery at a second point in time during the predetermined time period after the first point in time; and
   providing, to the electric motor, an electrical current from the battery system at a second electrical current level that does not exceed the maximum current level to operate the electric motor, the second electrical current level being less than the first electrical current level.

2. The method of claim 1, the identifying, of the maximum current level further comprising:
   identifying, with the battery management system, the maximum current level based on a square root of a quotient of a difference between the first level of energy subtracted from the predetermined total energy limit divided by the remainder of the predetermined time period.

3. A vehicle control system in a vehicle comprising:
   a current sensor connected to a battery in the vehicle that provides electrical current to an electric motor in the vehicle;
   an input device configured to provide an input corresponding to a level of electrical current that the battery provides to the electric motor;
   a battery management system connected to the current sensor, the battery, and the input device, the battery management system being configured to:
   generate, a plurality of current level measurements of the electrical current that the battery in the battery system provides to the electric motor using the current sensor during a predetermined time period;
   identify a first level of energy provided by the battery system to the electric motor at a first point in time after a start of the predetermined time period based on a summation of squares of the plurality of current level measurements;
   identify a maximum current level that can be provided to the electric motor from the battery during a remainder of the predetermined time period after the first point in time and prior to an expiration of the predetermined time period to enable a total level of energy provided to the electric motor by the battery during the entire predetermined time period to remain below a predetermined total energy limit;
   receive an input from the input device corresponding to a first electrical current level to be applied to the electric motor in the vehicle from the battery at a second point in time during the predetermined time period after the first point in time; and
   provide, to the electric motor, an electrical current from the battery system at a second electrical current level that does not exceed the maximum current level to operate the electric motor, the second electrical current level being less than the first electrical current level.

4. The vehicle control system of claim 3, the battery management system being further configured to:
   identify the maximum current level based on a square root of a quotient of a difference between the first level of energy subtracted from the predetermined total energy limit divided by the remainder of the predetermined time period.

5. The vehicle control system of claim 3, wherein the input device further comprises a pedal.

* * * * *